(12) United States Patent
Wilson et al.

(10) Patent No.: US 8,148,203 B2
(45) Date of Patent: Apr. 3, 2012

(54) TECHNIQUE FOR STABLE PROCESSING OF THIN/FRAGILE SUBSTRATES

(75) Inventors: Robin Wilson, Holywood (GB); Conor Brogan, Belfast (GB); Hugh J. Griffin, Newtownabbey (GB); Cormac MacNamara, Belfast (GB)

(73) Assignee: Icemos Technology Ltd., Belfast (GB)

( * ) Notice: Subject to any disclaimer, the term of this patent is extended or adjusted under 35 U.S.C. 154(b) by 0 days.

(21) Appl. No.: 13/179,170

(22) Filed: Jul. 8, 2011

(65) Prior Publication Data

US 2011/0266659 A1 Nov. 3, 2011

Related U.S. Application Data

(60) Division of application No. 12/203,995, filed on Sep. 4, 2008, now Pat. No. 7,999,348, which is a continuation of application No. 11/380,457, filed on Apr. 27, 2006, now Pat. No. 7,429,772.

(51) Int. Cl.
*H01L 21/00* (2006.01)

(52) U.S. Cl. ............... 438/110; 257/499; 257/E21.214; 257/E23.194

(58) Field of Classification Search .............. 438/110; 257/499, E21.214, E23.194
See application file for complete search history.

(56) References Cited

U.S. PATENT DOCUMENTS

| | | | |
|---|---|---|---|
| 4,211,582 A | 7/1980 | Horng et al. | |
| 4,238,278 A | 12/1980 | Antipov | |
| 4,491,486 A | 1/1985 | Iwai | |
| 4,866,004 A | 9/1989 | Fukushima | |
| 4,895,810 A | 1/1990 | Meyer et al. | |
| 4,994,406 A | 2/1991 | Vasquez et al. | |
| 5,019,522 A | 5/1991 | Meyer et al. | |
| 5,366,914 A | 11/1994 | Takahashi et al. | |
| 5,432,113 A | 7/1995 | Tani | |
| 5,479,048 A | 12/1995 | Yallup et al. | |
| 5,585,285 A | 12/1996 | Tang | |
| 5,902,127 A | 5/1999 | Park | |
| 5,926,713 A | 7/1999 | Hause et al. | |

(Continued)

FOREIGN PATENT DOCUMENTS

WO 2005001941 A2 1/2005

(Continued)

OTHER PUBLICATIONS

Dictionary.com www.dictionary.reference.com. U.S. Appl. No. 11/380,457—Patent No. 7,429,777.

*Primary Examiner* — Bradley K Smith
*Assistant Examiner* — Marvin Payen
(74) *Attorney, Agent, or Firm* — Panitch Schwarze Belisario & Nadel LLP

(57) ABSTRACT

A semiconductor on insulator (SOI) wafer includes a semiconductor substrate having first and second main surfaces opposite to each other. A dielectric layer is disposed on at least a portion of the first main surface of the semiconductor substrate. A device layer has a first main surface and a second main surface. The second main surface of the device layer is disposed on a surface of the dielectric layer opposite to the semiconductor substrate. A plurality of intended die areas are defined on the first main surface of the device layer. The plurality of intended die areas are separated from one another. A plurality of die access trenches are formed in the semiconductor substrate from the second main surface. Each of the plurality of die access trenches are disposed generally beneath at least a respective one of the plurality of intended die areas.

14 Claims, 5 Drawing Sheets

U.S. PATENT DOCUMENTS

| | | |
|---|---|---|
| 6,174,773 B1 | 1/2001 | Fujishima |
| 6,214,698 B1 | 4/2001 | Liaw et al. |
| 6,495,421 B2 | 12/2002 | Luo |
| 6,534,367 B2 | 3/2003 | Farr et al. |
| 6,613,644 B2 | 9/2003 | Lachner |
| 6,762,473 B1 | 7/2004 | Goushcha et al. |
| 6,797,589 B2 | 9/2004 | Adams et al. |
| 6,940,144 B2 | 9/2005 | Nakayama |
| 7,015,104 B1 | 3/2006 | Blanchard |
| 7,023,069 B2 | 4/2006 | Blanchard |
| 7,041,560 B2 | 5/2006 | Hshieh |
| 7,052,982 B2 | 5/2006 | Hshieh et al. |
| 7,429,772 B2 | 9/2008 | Wilson et al. |
| 7,439,178 B2 | 10/2008 | Wilson et al. |
| 2004/0157410 A1 | 8/2004 | Yamaguchi |
| 2005/0176192 A1 | 8/2005 | Hshieh |
| 2006/0079024 A1 | 4/2006 | Akram |
| 2007/0166997 A1 | 7/2007 | Knorr |
| 2007/0262378 A1 | 11/2007 | Wilson et al. |

FOREIGN PATENT DOCUMENTS

| | | |
|---|---|---|
| WO | 2005001941 A3 | 1/2005 |
| WO | 2005031880 A1 | 4/2005 |

# TECHNIQUE FOR STABLE PROCESSING OF THIN/FRAGILE SUBSTRATES

CROSS REFERENCE TO RELATED APPLICATIONS

This application is a divisional application of U.S. patent application Ser. No. 12/203,995, filed Sep. 4, 2008, currently pending, entitled, "Technique for Stable Processing of Thin/Fragile Substrates," which is a continuation application of U.S. patent application Ser. No. 11/380,457, filed Apr. 27, 2006, now U.S. Pat. No. 7,429,772, entitled, "Technique for Stable Processing of Thin/Fragile Substrates," the entire contents of all of which are incorporated by reference herein.

BACKGROUND OF THE INVENTION

The present invention generally relates to a method of manufacturing a semiconductor device, and more particularly, to a method for using a silicon on insulator (SOI) semiconductor wafer for manufacturing devices having very thin and fragile substrates.

Semiconductor wafer fabrication generally refers to the process of making integrated circuits on silicon wafers. A typical semiconductor wafer is generally circular in plan view and has a diameter on the order of 25-300 millimeters (mm). Individual electronic circuits or devices are formed across at least one surface of the wafer and then the wafer is typically cut (sawed or diced) into a plurality of individual "dies" for packaging into individual integrated circuits (ICs).

Silicon on insulator (SOI) semiconductors, dielectric isolation (DI) semiconductors and bonded wafer semiconductor devices are generally known in the art. For example, basic known processes to bond semiconductor wafers include forming a layer of silicon dioxide on one silicon wafer, sometimes referred to as the "handle wafer" and placing the other wafer on the silicon dioxide and annealing (i.e., generally heating to and holding at a suitable temperature and then cooling at a suitable rate) the stacked wafers to form a bonded wafer semiconductor device having a buried oxide layer. Other methods of forming SOI semiconductor wafers are also known.

A handle wafer can be used to handle a semiconductor wafer during processing. Typically the device layer of semiconductor material is processed, e.g., trenched, implanted, doped, polished or the like, and is therefore moved from process to process. As device layers shrink or become more thin, they also become more fragile and hard to handle during processing.

Wafer sawing or dicing is a processing step that actually cuts the wafer into individual dies for assembly into IC packages. The wafer saw process typically includes mounting the wafer to a frame, cutting the wafer through its thickness according to the programmed die dimensions using a diamond cutting wheel rotating at a very high speed and cleaning the wafer using high pressure water spray. Alternately, wafers can be diced using a water-jet-guided laser. Improper wafer sawing can result in cracks in the wafers which is often referred to as die cracking. Even proper sawing may lead to die cracking in very thin wafers.

It is desirable to provide a technique to allow stable processing of thin and fragile semiconductor substrates. It is desirable to provide a method of manufacturing such thin semiconductor devices using SOI wafers and a deep trench etch. It is also desirable to provide a technique to manufacture larger diameter wafers with a lower level of breakage and/or die cracking.

BRIEF SUMMARY OF THE INVENTION

Briefly stated, an embodiment of the present invention relates to a semiconductor on insulator (SOI) wafer that includes a semiconductor substrate having first and second main surfaces opposite to each other. A dielectric layer is disposed on at least a portion of the first main surface of the semiconductor substrate. A device layer has a first main surface and a second main surface. The second main surface of the device layer is disposed on a surface of the dielectric layer opposite to the semiconductor substrate. A plurality of intended die areas are defined on the first main surface of the device layer. The plurality of intended die areas are separated from one another. A plurality of die access trenches are formed in the semiconductor substrate from the second main surface. Each of the plurality of die access trenches are disposed generally at least partially beneath at least a respective one of the plurality of intended die areas.

Another embodiment of the present invention relates to a method of manufacturing semiconductor devices that includes providing a first semiconductor substrate having first and second main surfaces opposite to each other. A dielectric layer is formed on the first main surface of the first semiconductor substrate. A second semiconductor substrate is provided and the second semiconductor substrate has first and second main surfaces opposite to each other. The second semiconductor substrate is disposed on the dielectric layer opposite to the first semiconductor substrate. Portions of the first semiconductor substrate are selectively removed to form a plurality of die access trenches in the second main surface of the first semiconductor substrate. Each of the plurality of die access trenches defines at least a respective one of a plurality of intended die areas on the first main surface of the second semiconductor substrate.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
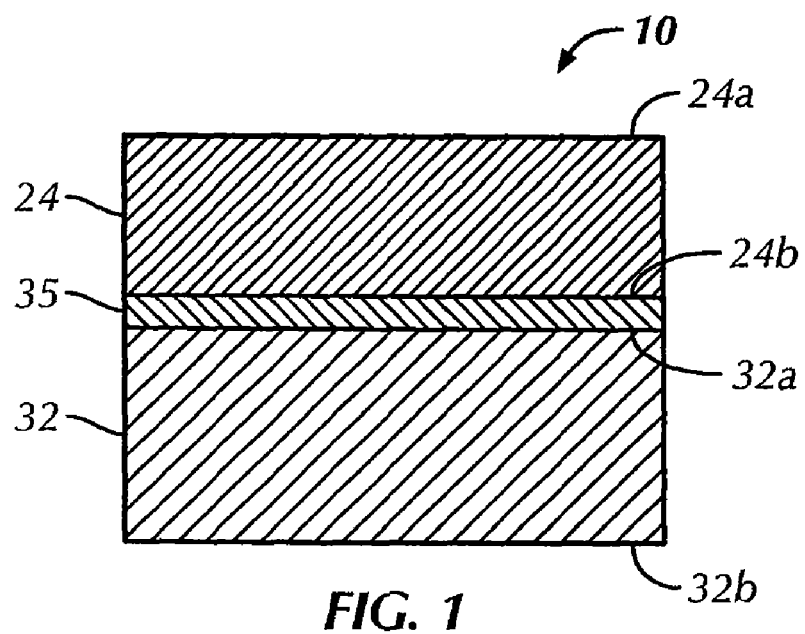
FIG. 1 is a partial cross sectional side elevational view of a semiconductor on insulator (SOI) wafer in accordance with preferred embodiments of the present invention.

Certain terminology is used in the following description for convenience only and is not limiting. The words "right," "left," "lower," and "upper" designate directions in the drawings to which reference is made. The words "inwardly" and "outwardly" refer to direction toward and away from, respectively, the geometric center of the object described and designated parts thereof. The terminology includes the words above specifically mentioned, derivatives thereof and words of similar import. Additionally, the words "a" and "and" as used in the claims and in the corresponding portion of the specification means "at least one."

Although any particular embodiment of the present invention may refer to a particular conductivity (e.g., p-type or n-type), it will be readily understood by those skilled in the art that p-type conductivity can be switched with n-type conductivity and the device will still be functionally correct (i.e., a first or second conductivity type). Therefore, where used herein, the reference to n-type may be interchangeable with p-type and reference to p-type may be interchangeable with n-type.

Referring to the drawings in detail, wherein like numerals reference like elements throughout, there is shown in FIG. 1 an semiconductor on insulator (SOI) wafer 10 for use with preferred embodiments of the present invention. The SOI wafer 10 includes a first semiconductor substrate or "handle wafer" 32, a dielectric layer or buried oxide layer 35 and a second semiconductor substrate or device layer 24. The handle wafer 32 has a thickness of several hundred micrometers or microns (μm), e.g., a thickness of about 100-1000 μm. The dielectric or buried oxide layer 35 has a thickness of about 0.1 to 5 μm. The device layer 24 has a thickness of several microns, e.g., a thickness of 2-250 μm.

Generally, device layers 24 having a thickness of 100 μm or less will be very fragile and will be well suited to handling during manufacturing using the SOI wafer 10 to provide more stability during processing and sawing/dicing. More stability of fragile device layers 24 will lead to higher production yields for a given size wafer dimension (e.g., 100 mm, 200 mm, 300 mm, etc.). Additionally, providing more stability for fragile device layers 24 will permit using larger overall wafer dimensions.

Figure 2:
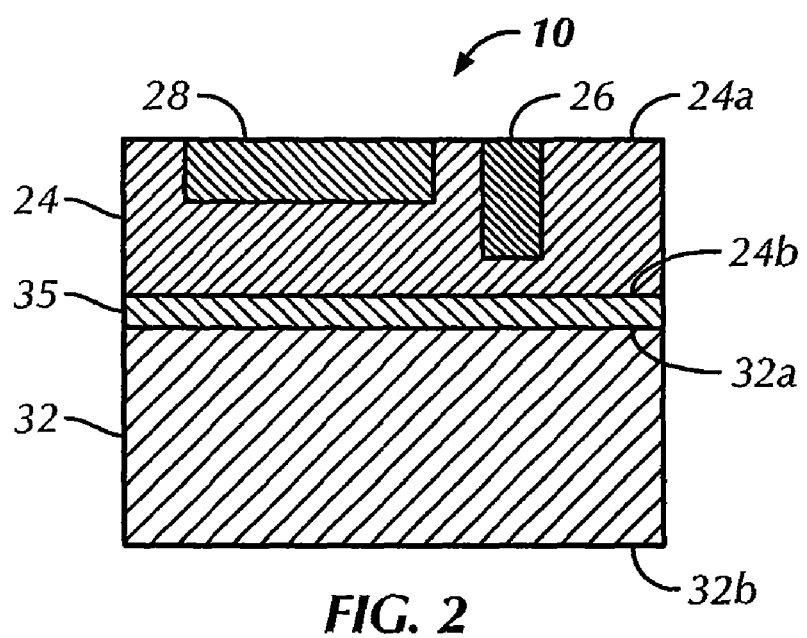
FIG. 2 is a partial cross sectional side elevational view of the 501 wafer of FIG. 1 after at least one processing step has been applied to a device layer.
Figure 3:
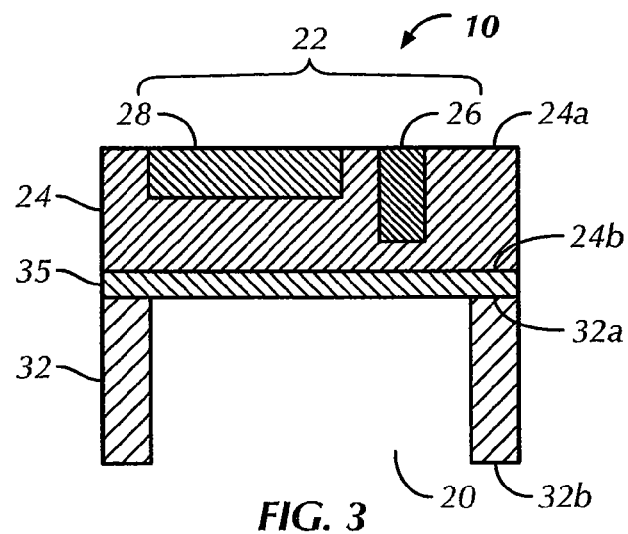
FIG. 3 is a partial cross sectional side elevational view of the SOI wafer of FIG. 2 after a semiconductor substrate (handle wafer) has been processed to include a plurality of die access trenches.

FIGS. 2-3 show steps for forming active devices in isolated regions referred to as intended die areas or actual dies 22 on the device layer 24. At least one typical semiconductor processing step is performed on the device layer 24 such as trenching, implanting, doping, etching, oxidizing or the like. For example, a transistor or photodiode may be formed in the device layer 24. For example, the device layer 24 may be trenched and the trench may be refilled with an oxide or other dielectric 26 to form an isolation region or the device layer 24 may be masked and selectively doped to form a drain. region or source region 28. The type of device formed in the device layer 24 is not significant to the embodiments of the present invention.

Optionally, the SOI wafer 10 is trenched to provide the plurality of die access trenches 20, but the device layer 24 is provided as a "blank" for customer end-processing. A "mask template" can be provided to the customer which corresponds to the plurality of die access trenches 20 so that the customer can customize any front-side device layer masks to their custom purpose. For example, the first semiconductor substrate 32 has first and second main surfaces 32a, 32b opposite to each other. The dielectric layer or buried oxide layer 35 is formed on the first main surface 32a of the first semiconductor substrate 32. The second semiconductor substrate or device layer 24 is provided and the second semiconductor substrate 24 has first and second main surfaces 24a, 24b opposite to each other. The second semiconductor substrate 24 is disposed on the dielectric layer 35 opposite to the first semiconductor substrate 32. Portions of the first semiconductor substrate 32 are selectively removed to form the plurality of die access trenches 20 in the second main surface 32b of the first semiconductor substrate 32. Each of the plurality of die access trenches 20 defines a respective one of a plurality of intended die areas 22 defined on or in the first main surface 24a of the second semiconductor substrate 24.

The first main surface 32a may be ground and/or polished flat using known processes, such as mechanical or chemical grinding, etching and/or polishing processes. Preferably, the handle wafer 32 is formed of silicon (Si). But, the handle wafer 32 may be formed of other materials such as gallium arsenide (GaAs), germanium (Ge) or the like. Preferably, the first main surface 32a is ground and/or polished sufficiently to leave a polished, flat, clean surface, which is ideally defect free. The second main surface 32b may be lapped and etched using a known lapping and/or etching process. The handle wafer 32 is then oxidized to form the buried oxide layer 35. The buried oxide layer 35 is applied using one of thermal growth, low pressure (LP) chemical vapor deposition (CVD), plasma enhanced chemical vapor deposition (PECVD), atmospheric pressure chemical vapor deposition (APCVD) and deposition. The buried oxide layer 35 is preferably formed of an oxide. Alternatively, the buried oxide layer 35 may be a nitride, silicon-oxynitride or other known dielectrics. The buried oxide layer 35 on the handle wafer 32 may be formed by any known technique.

The device layer 24 can be formed by bonding or otherwise forming a semiconductor layer on the buried oxide layer 35. Preferably, the device layer 24 is silicon. But, the device layer 24 may be formed of other materials such as gallium arsenide, germanium or the like. For example, the device layer 24 is typically a doped p-type or n-type silicon layer.

Figure 4:
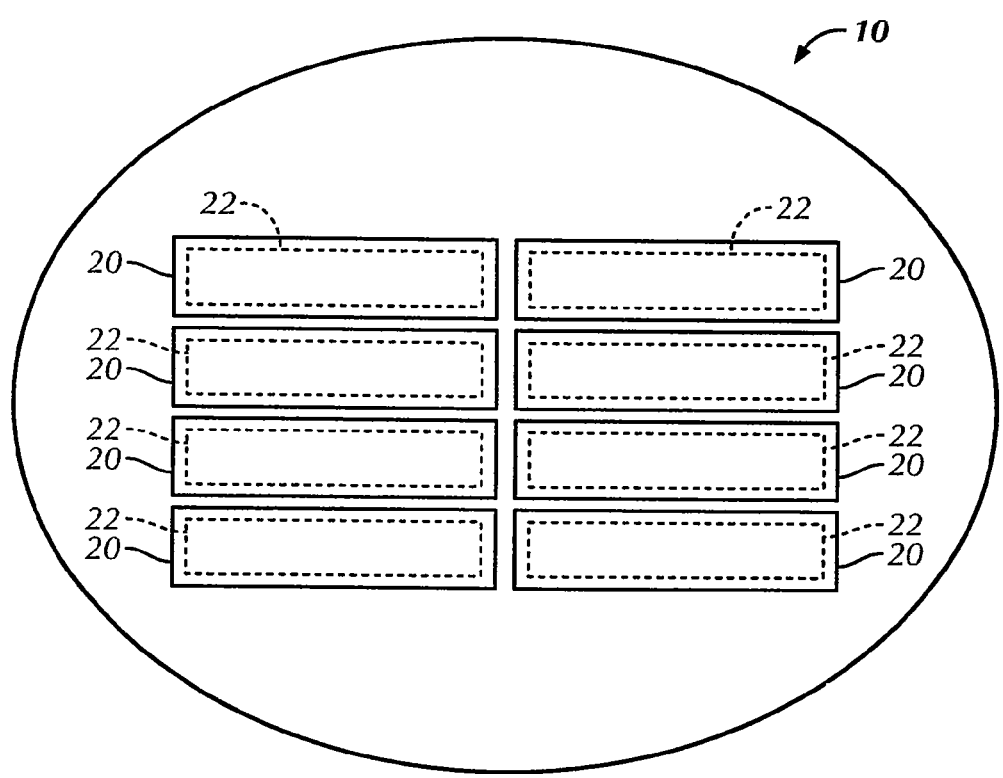
FIG. 4 is a top plane view of an SOI wafer having a plurality of intended die areas or dies and a plurality of backside die access trenches associated therewith.

The SOI wafer 10, as shown in plan view in FIG. 4, may be of any dimension or geometric shape. Typically, the SOI wafer 10 is generally circular in plan view and has a diameter on the order of 25-300 mm or more.

Known processing techniques such as grinding, polishing and etching may be performed to obtain a desired thicknesses of the handle wafer 32, buried oxide layer 35 and device layer 24. Generally, semiconductor wafers 10 are coarsely thinned by a grinding machine having a rough grinding wheel or grinding pad such as a diamond or carbide wheel or pad having for example, diamond impregnated resin teeth. Grinding the wafer 10 also allows for thinner, and therefore, smaller IC packages. Generally, polishing is a finer process using a wet silica-particle slurry which is washed across the surface of the SOI wafer 10 at a predetermined flow rate and is referred to as chemical mechanical polishing (CMP). Optionally, surfaces of the SOI wafer 10 are thinned by grinding and then polishing.

The second main surface 32b of the handle wafer 32 is masked and etched according to specific patterns (see e.g., FIG. 4). Masking may be performed by photolithography, electron lithography or the like, as is known in the art. As shown in FIG. 3, the second main surface 32b of the handle wafer 32 is then trenched by etching (i.e., removing unmasked material) to form a plurality of die access trenches 20 (FIG. 4).

Each of the die access trenches 20 in the handle wafer 32 exposes a backside of one of the respective intended die areas or dies 22. As best shown in the bottom plan view of FIGS. 4-5, the full thickness of the remainder of the handle wafer surface is maintained to provide stability during any remaining semiconductor processing steps and especially during sawing or dicing. Preferably, as best shown in FIG. 3, etching will stop on the buried oxide layer 35 which can be subsequently removed if desired or remain to form a mask for future backside processes. Optionally, backside processing steps can be performed on the bottoms of the intended die areas or dies 22 to form, e.g., backside contacts or the like (not shown). Sufficient space remains between adjacent dies 22 so that sawing or dicing may be performed to separate the plurality of dies 22 for individual packaging or the like.

Figure 5:
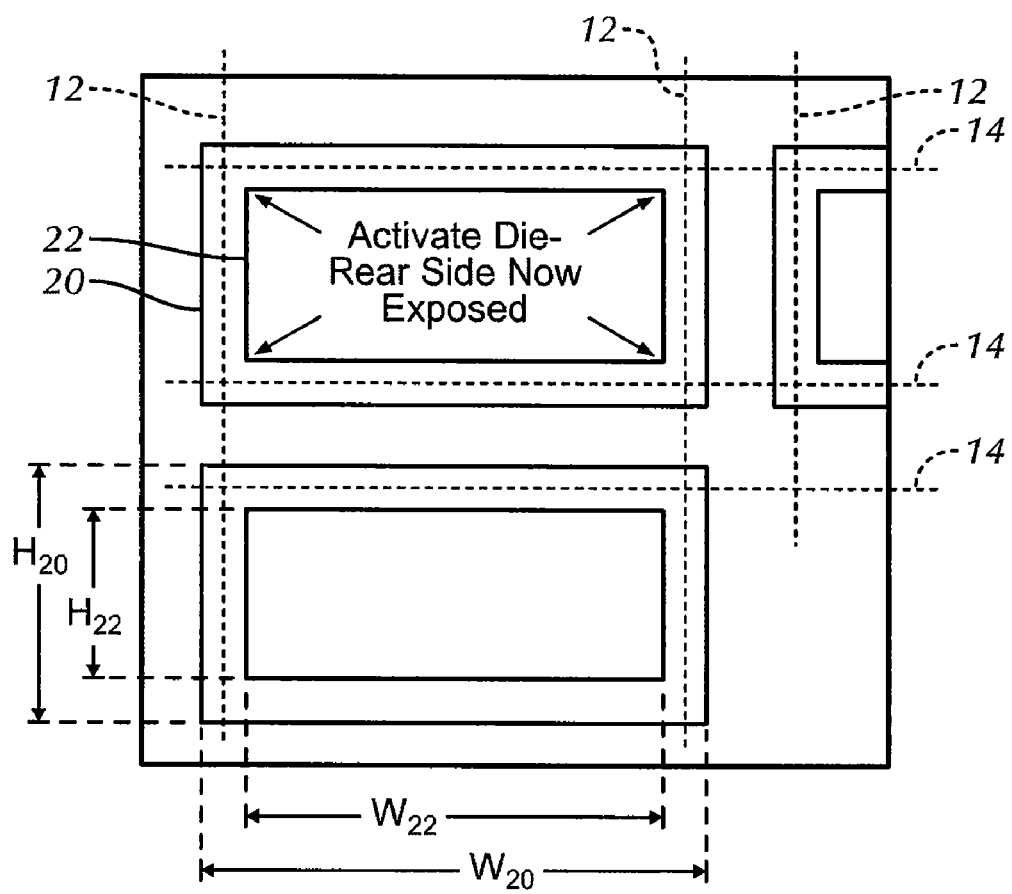
FIG. 5 is a greatly enlarged bottom plan view of the SOI wafer of FIG. 4 showing saw/cut lines.

Referring to FIG. 5, the intended die area or the active die 22 is exposed. Saw lines or cut lines 12 and 14 show the center of the cut line with allowance made on either side of the saw lines 12, 14 to accommodate saw blade width, over cutting and material fracture. The remaining portions of the handle wafer 35 and the edge of the active die 22 are beyond the influence of the cutting tool, for example, saw blade, water jet, laser or the like. Each of the plurality of die access trenches 20 has a width dimension $W_{20}$ that is greater than a width dimension $W_{22}$ of the respective one of the plurality of intended die areas or dies 22. Preferably, the width dimension $W_{20}$ of each of the plurality of die access trenches 20 is greater than the width dimension $W_{22}$ of the respective one of the plurality of intended die areas or dies 22 by at least a saw/dice cutting tolerance. Likewise, Each of the plurality of die access trenches 20 has a height dimension $H_{20}$ that is greater than a height dimension $H_{22}$ of the respective one of the plurality of intended die areas or dies 20. Preferably, the height dimension $H_{20}$ of each of the plurality of die access trenches 20 is greater than the height dimension $H_{22}$ of the respective one of the plurality of intended die areas or dies 22 by at least a saw/dice cutting tolerance. Thus, the die access trenches 20 are larger in dimension than the active dies 22 by at least one "saw street width" around the perimeter of the die 22. A "saw street width" generally means the full dimensional width of a cut caused by a saw or grinding wheel which may be slightly wider than the blade or wheel itself due to a number of factors such as ripping.

The plurality of die access trenches 20 may be formed in the second main surface 32B of the handle wafer 32 by a process such as plasma etching, reactive ion etching (RIE), sputter etching, vapor phase etching, chemical etching, deep RIE or the like. Utilizing deep RIE, die access trenches 20 can be formed having depths of about 40 to 300 μm or even deeper.

The intended die areas or dies 22 and the die access trenches 20 are depicted in FIG. 5 as generally rectangular in shape, but the dies 22 and the die access trenches 20 may be other shapes such as square, ovoid, circular or the like.

Optionally, a given die access trench 20 may provide access to more than one die 22.

Figure 6:
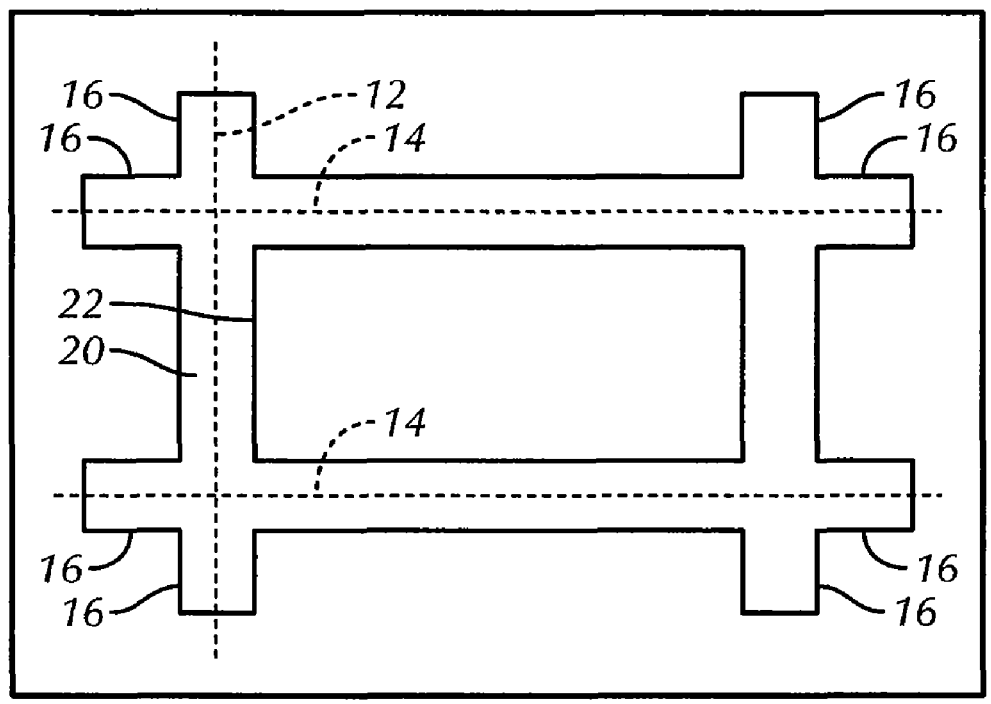
FIG. 6 is a greatly enlarged bottom plan view of an alternate embodiment of the SOI wafer of FIG. 5.

Damage is more likely to occur to the SOI wafer 10 during sawing/dicing where loading changes dramatically, such as the transition between the exposed trench section 20 and the areas of remaining handle wafer 35. Accordingly, FIG. 6 shows a greatly enlarged bottom plan view of an alternate embodiment of the SOI wafer 10 wherein the trenches 20 have stress relief trenches 16 partially formed along the along intended cutting lines 12, 14 to improve sawing/dicing and reduce possible stress caused thereby.

Figure 7:
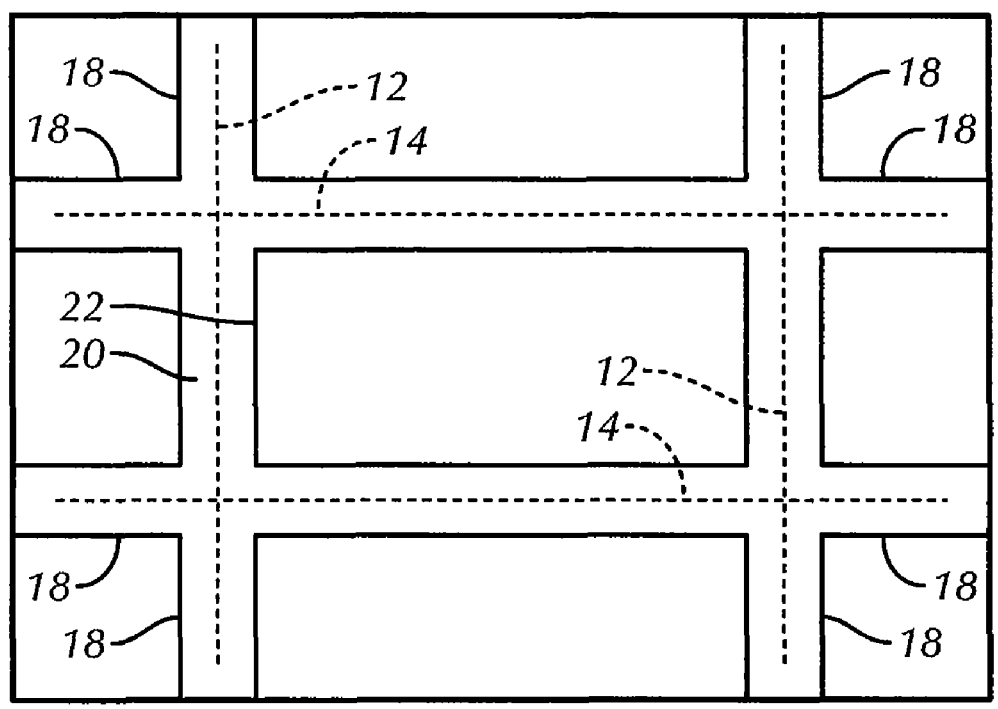
FIG. 7 is a greatly enlarged bottom plan view of an alternate embodiment of the SOI wafer of FIG. 5.

FIG. 7 shows a greatly enlarged bottom plan view of another alternate embodiment of the SOI wafer 10 wherein stress relief trenches 18 are provided along the entire length of the along intended cutting lines 12, 14 to improve sawing/dicing and reduce possible stress caused thereby.

From the foregoing, it can be seen that embodiments of the present invention are directed to methods for using a SOI semiconductor wafer for manufacturing devices having very thin and fragile substrates. It will be appreciated by those skilled in the art that changes could be made to the embodiments described above without departing from the broad inventive concept thereof It is understood, therefore, that this invention is not limited to the particular embodiments disclosed, but it is intended to cover modifications within the spirit and scope of the present invention as defined by the appended claims.

We claim:

1. A method of manufacturing semiconductor devices comprising:
   providing a support substrate having first and second main surfaces opposite to each other;
   providing a semiconductor substrate having first and second main surfaces opposite to each other, the semiconductor substrate being disposed on the first main surface of the support substrate; and
   selectively removing portions of the support substrate to form a plurality of die access trenches in the second main surface of the support substrate, each of the plurality of die access trenches having a width dimension and a height dimension defining an area, each of the areas of the plurality of die access trenches defining at least a respective one of a plurality of intended die areas defined on the first main surface of the semiconductor substrate.

2. The method according to claim 1, wherein the width dimension of each of the plurality of die access trenches is greater than a width dimension of the at least respective one of the plurality of intended die areas.

3. The method according to claim 2, wherein the width dimension of each of the plurality of die access trenches is greater than the width dimension of the at least respective one of the plurality of intended die areas by at least a saw/dice cutting tolerance.

4. The method according to claim 1, wherein the height dimension of each of the plurality of die access trenches is greater than a height dimension of the at least respective one of the plurality of intended die areas.

5. The method according to claim 4, wherein the height dimension of each of the plurality of die access trenches is greater than the height dimension of the at least respective one of the plurality of intended die areas by at least a saw/dice cutting tolerance.

6. The method according to claim 1, further comprising:
   selectively removing portions of the support substrate to form a plurality of stress relief trenches formed at least partially along intended cutting lines.

7. The method according to claim 6, wherein the plurality of stress relief trenches are formed substantially along intended cutting lines.

8. The method according to claim 1, further comprising:
   forming a dielectric layer on the first main surface of the support substrate.

9. The method according to claim 8, wherein the dielectric layer is a buried oxide layer.

10. The method according to claim 1, wherein the plurality of die access trenches are formed by one of plasma etching, reactive ion etching (RIE), sputter etching, vapor phase etching and chemical etching.

11. The method according to claim 1, further comprising:
performing at least one processing step on the first main surface of the semiconductor substrate in order to provide a plurality of semiconductor dies in at least some of the plurality of intended die areas.

12. The method according to claim 1, wherein a die is formed in each of the plurality of intended die areas.

13. A semiconductor device formed by the method of claim 1.

14. A semiconductor device formed by a method comprising:
providing a first semiconductor substrate having first and second main surfaces opposite to each other;
forming a dielectric layer on the first main surface of the first semiconductor substrate;
providing a second semiconductor substrate having first and second main surfaces opposite to each other, the second semiconductor substrate being disposed on the dielectric layer opposite to the first semiconductor substrate; and
selectively removing portions of the first semiconductor substrate to form a plurality of die access trenches in the second main surface of the first semiconductor substrate, each of the plurality of die access trenches having a width dimension and a height dimension defining an area, each of the areas of the plurality of die access trenches defining at least a respective one of a plurality of intended die areas defined on the first main surface of the second semiconductor substrate.

* * * * *